US011933506B2

(12) United States Patent
Ranjan et al.

(10) Patent No.: US 11,933,506 B2
(45) Date of Patent: Mar. 19, 2024

(54) EXTRACTING AND PUBLISHING POINT DATA FROM A BUILDING SITE MODEL

(71) Applicant: Honeywell International Inc., Morris Plains, NJ (US)

(72) Inventors: Prabhat Ranjan, Bangalore (IN); Jerry Marti, West Salem, OH (US); Jitendra Jain, Bangalore (IN); Ripunjeet Dutta, Bangalore (IN)

(73) Assignee: HONEYWELL INTERNATIONAL INC., Charlotte, NC (US)

(*) Notice: Subject to any disclaimer, the term of this patent is extended or adjusted under 35 U.S.C. 154(b) by 638 days.

(21) Appl. No.: 16/211,000

(22) Filed: Dec. 5, 2018

(65) Prior Publication Data
US 2020/0182498 A1    Jun. 11, 2020

(51) Int. Cl.
*G06F 16/9035*    (2019.01)
*F24F 11/30*    (2018.01)
(Continued)

(52) U.S. Cl.
CPC .............. *F24F 11/30* (2018.01); *F24F 11/54* (2018.01); *G06F 16/9035* (2019.01);
(Continued)

(58) Field of Classification Search
CPC ................... F24F 11/30; F24F 2120/10; F24F 11/32–11/88; F24F 2120/00;
(Continued)

(56) References Cited

U.S. PATENT DOCUMENTS

| 6,832,120 B1 | 12/2004 | Frank et al. |
| 2015/0323918 A1* | 11/2015 | Nair ...................... G06F 16/904 700/275 |

(Continued)

FOREIGN PATENT DOCUMENTS

| WO | WO2018/098151 | * | 5/2018 | ............. G06F 17/30 |

OTHER PUBLICATIONS

Ploennigs et al. "BASont—A modular, adaptive Building Automation System Ontology" IECON 2012, IEEE Xplore; DOI: 10.1109/IECON.2012.6389583 [retrieved on May 21, 2021] (Year: 2012).*

(Continued)

*Primary Examiner* — Rehana Perveen
*Assistant Examiner* — Alfred H B Wechselberger
(74) *Attorney, Agent, or Firm* — Seager, Tufte & Wickhem, LLP (57) ABSTRACT

Operating heating, ventilation, and air conditioning systems using occupancy sensing are described herein. One device includes instructions which cause a processor to receive building information including information defining a plurality of spaces of a building, occupancy sensing system information describing a location of each of a plurality of occupancy sensing system fixtures with respect to a representation of the building, and heating, ventilation, and air conditioning (HVAC) system information describing a relationship between the plurality of spaces and a plurality of HVAC devices installed in the building, create a mapping between a space of the plurality of spaces, a fixture of the plurality of fixtures, and an HVAC device of the plurality of HVAC devices based on the building information, and modify an operation of the HVAC device based on the mapping and responsive to a determination of occupancy in the space by the fixture.

18 Claims, 5 Drawing Sheets

(51) Int. Cl.
| | |
|---|---|
| *F24F 11/54* | (2018.01) |
| *G06F 30/13* | (2020.01) |
| *G06F 30/18* | (2020.01) |
| *G06F 30/20* | (2020.01) |
| *F24F 120/10* | (2018.01) |

(52) U.S. Cl.
CPC .............. *G06F 30/13* (2020.01); *G06F 30/18* (2020.01); *G06F 30/20* (2020.01); *F24F 2120/10* (2018.01)

(58) Field of Classification Search
CPC ...... F24F 2140/00; G06F 30/20; G06F 30/13; G06F 30/18; G06F 16/9035; G06F 16/903; G06F 30/12; G06F 30/25; G06F 30/27; G06F 30/28; G06F 2111/00–2119/22
See application file for complete search history.

(56) References Cited

U.S. PATENT DOCUMENTS

| | | | | |
|---|---|---|---|---|
| 2016/0128043 | A1 | 5/2016 | Shuman et al. | |
| 2016/0210569 | A1* | 7/2016 | Enck | G06Q 10/0637 |
| 2016/0275606 | A1 | 9/2016 | Aravala et al. | |
| 2017/0163608 | A1 | 6/2017 | Bicket et al. | |
| 2018/0260101 | A1* | 9/2018 | Przybylski | G06F 8/45 |
| 2018/0309818 | A1* | 10/2018 | Park | H04L 67/10 |
| 2018/0323645 | A1* | 11/2018 | Wilberforce | H02J 13/00002 |
| 2019/0235454 | A1* | 8/2019 | Reichl | G05B 19/042 |
| 2019/0310836 | A1* | 10/2019 | Reichl | G06F 8/61 |
| 2020/0110377 | A1* | 4/2020 | Chatterjee | G05B 19/042 |

OTHER PUBLICATIONS

Brunner et al. "The software design of a dynamic building model service" Proceedings of the 22nd CIB W [retrieved on May 20, 2021] (Year: 2005).*

Fuller, P. "A simplified software architecture for self-updating Building Information Models (BIM)" [thesis] Civil and Environment Engineering Dept, MIT [retrieved on May 19, 2021] (Year: 2009).*

Li et al. "Efficient and scalable IoT service delivery on Cloud" 2013 IEEE 6th Int Conf. on Cloud Computing, IEEE Xplore; DOI: 10.1109/CLOUD.2013.64 [retrieved on May 21, 2021] (Year: 2013).*

Lee et al. "A Smart Gateway Framework for IOT Services" 2016 iThings and GreenCom, and CPSCom, and SmartData, IEEE Xplore; DOI: 10.1109/iThings-GreenCom-CPSCom-SmartData.2016.44 [retrieved on May 20, 2021] (Year: 2016).*

Liu et al. "A Framework for Integrating Change Management with Building Information Modeling" Computing in Civil and Building Engineering, ASCE [retrieved on May 18, 2021] (Year: 2014).*

Kucera, A. "Semantics-Driver Middleware Layer for Building Operation Analysis in Large-Scale Environments" [Thesis] Masaryk University, Faculty of Informatics [retrieved on Dec. 4, 2021] (Year: 2017).*

Zach, Robert, et al. "A distributed and scalable approach to building monitoring." J. Inf. Technol. Constr. 20 (2015): pp. 159-172 [retrieved on Dec. 4, 2021] (Year: 2014).*

Chen et al. "The Design and Implementation of a Smart Building Control System" 2009 IEEE International Conference on e-Business Engineering [retrieved on May 20, 2021] (Year: 2009).*

Wang et al. "Integrating Building Management System and facilities management on the Internet" Automation in Construction vol. 11 (2002), pp. 707-715 [retrieved on Mar. 21, 2022] (Year: 2002).*

Bonino et al. "The DOG Gateway: Enabling Ontology-based Intelligent Domotic Environments" IEEE Transactions on Consumer Electronics, vol. 54, No. 4, Nov. 2008 [retrieved on Mar. 21, 2022] (Year: 2008).*

Dawson-Haggerty, S. "Building Operating Systems Services: An Architecture for Programmable Buildings" [Thesis] Computer Science, University of California, Berkeley [retrieved on Oct. 3, 2022] (Year: 2014).*

Kefalakis, N. "OpenIoT: Open Source Internet-of-Things in the Cloud" (Eds.): FP7 OpenIoT Project Workshop 2014, LNCS 9001, pp. 13-25, 2015; DOI: 10.1007/978-3-319-16546-2_3 [retrieved on Oct. 8, 2022] (Year: 2015).*

Pelesic, I. "Semantic Interoperability Layer for oBIX" [Thesis] Technische Informatick, Technischen Universitat Wien [retrieved on Oct. 10, 2022] (Year: 2017).*

McCarthy et al. "A Data Access Framework for Integration to Facilitate Efficient Building Operation" 2014 IEEE Emerging Technology and Factory Automation (ETFA) (Year: 2014).*

Gao, J. "A Metadata Inference Framework to Provide Operational Information Support for Fault Detection and Diagnosis Applications in Secondary HVAC Systems" [Thesis] Civil and Environment Engineering, Carnegie Mellon (Year: 2017).*

Fernbach et al. Semi-automated Engineering in Building Automation Systems and Management Integration 2017 IEEE 26th International Symposium on Industrial Electronics (ISIE) (Year: 2017).*

Renstrom, M. "Internet of Things architectures for the Buildings of Tomorrow" [Thesis] KTH Industrial Engineering and Management (Year: 2017).*

Krukoski et al. "Comprehensive Building Information Management System" IJSSST, vol. 11, No. 2, May 2010 (Year: 2010).*

\* cited by examiner

EXTRACTING AND PUBLISHING POINT DATA FROM A BUILDING SITE MODEL

TECHNICAL FIELD

The present disclosure relates to methods and systems for extracting and publishing point data from a building site model.

BACKGROUND

Building control systems, as used herein, describe complex systems that may control: multiple devices as a group that are associated with a building, multiple groups of devices within a building, and/or devices of multiple buildings within a campus or devices of multiple buildings dispersed in different locations. For example, a building control system can be used to monitor and control the operation of multi-site retail facilities from a central location via the intranet of the facilities. Accordingly, when a building control system for a site is to be added to a building management system (BMS), which manages one or more of the control settings or operations of the building control system, the setup of this building control system within the BMS can be complex and time consuming.

Currently, there is no existing system which can help a system integrator (SI) (e.g., a person tasked with the setup of the building control system into the BMS) configure the BMS without physically visiting the site that is being controlled by the building control system. This can involve travel to each individual site, cost for accommodations, time to manually review the system can to determine device types and other device information, increased complexity in deployment, and other business costs.

DETAILED DESCRIPTION

Systems and methods for extracting and publishing point data from a building site model are described herein. For example, an embodiment includes a non-transitory machine readable medium storing instructions executable by a processing resource to receive instructions at a gateway device located in a local network from a building control system to extract point data from a building site model, extract point data from the building site model using building site model extraction details including at least one of a model tag, an extract tag, and a model ref, and publish the extracted point data to a central database to which the gateway device is registered.

A centralized mechanism, which may be referred to herein as a "gateway", may serve as a middle layer between the various building control systems deployed at various facilities (e.g., sites). For example, the various building control systems may have different structures and/or formats for their respective components (e.g., devices, controllers, equipment, points of interest, etc.) Such a gateway may provide a common normalized model of component data from the components controlled by the various building control systems, such that the data can take the same format for monitoring, managing, reporting, and/or analysis, regardless of the building control system (e.g., the structure and/or format of the building control system) from which it comes.

In order to establish an existing gateway system, however, a user (e.g., a site engineer or system integrator) may have to become familiar with the unique configuration of each different facility, discover and interpret the various components of each facility, and manually apply (e.g., add) modeling tags that identify the facility and each individual component within the specific data structure of the building control system for that facility. Such an operation would have to be manually performed for each respective facility and each respective building control system. Accordingly, the existing process of establishing a gateway system can be difficult and/or time consuming.

Embodiments of the present disclosure, in contrast, may include a gateway device configured to extract point data (e.g., retrieving point data from a building site model) using extraction details and publishing (e.g., saving) the extracted point data to a central database within the gateway system. Such a mechanism can make it quicker and easier to onboard (set up to interact within the BMS) various components of the various facilities into the gateway system than the existing manual approach. Further, such a mechanism may be a generalized tool that is applicable to any type of building control system.

For example, a gateway device in accordance with the present disclosure allows the components (e.g., devices, controllers, equipment, points of interest, etc.) controlled by different building control systems at different facilities (e.g., different sites) to be stored at a single gateway device. For instance, the single gateway device can extract data from the components controlled by the different control systems at different facilities using a set of extraction details and at a set interval of time. Such a mechanism can allow the gateway device to store contextually rich data to the central database, which can make it quicker and easier to apply rule-based modeling to the stored data.

Further, extraction details can allow the gateway device to extract contextually rich data by applying model tags, extract tags, and model references (refs). For instance, model tags can include tags that determine which components in the building control system are part of the building site model (e.g., a digital model of a site). Extract tags can include a set of tags that are extracted as a part of the building site model for each component. Model refs can include a set of relationships that would be traversed recursively to extract the building site model from the building control system. Applying model tags, extract tags, and model refs can provide context to the component data that is extracted from a building control system, which can make it easier and quicker to manage the components.

Further, the extracted point data can be automatically published to the central database at a set interval of time, which can make it quick and easy for data from different building control systems at different facilities to be stored in a single database. For instance, the gateway device can publish point data that has been extracted from the different building control systems using the extraction details and store the contextually rich point data in a single central database (e.g., a cloud computing environment) within the BMS.

The gateway device can also be configured to automatically detect a configuration change within the building control system and update the published point data, which can make it easier to sync point data when configuration changes occur. Further, the published point data can be exported for offline usage, which can make offline mapping easier.

Additionally, a user interface can be used to add and configure gateways for various central databases, which can allow for quickly adding and configuring gateways to publish extracted data to the central database of the user's choice. The user interface can also provide a gateway overview where the status of each gateway can be monitored along with registration status, latest data publish status, and configured site details. This allows the user to be able to easily ensure that the site has been correctly configured for point data publication. In the current system to get this information, the operator has to log into each individual site to retrieve these details, which can be time consuming. Presented below are some examples that illustrate how such a device can be set up in a building control system.

In the following detailed description, reference is made to the accompanying drawings that form a part hereof. The drawings show by way of illustration how embodiments of the disclosure may be practiced.

These embodiments are described in sufficient detail to enable those of ordinary skill in the art to practice embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

The figures herein follow a numbering convention in which the first digit or digits correspond to the drawing figure number and the remaining digits identify an element or component in the drawing.

Figure 1:
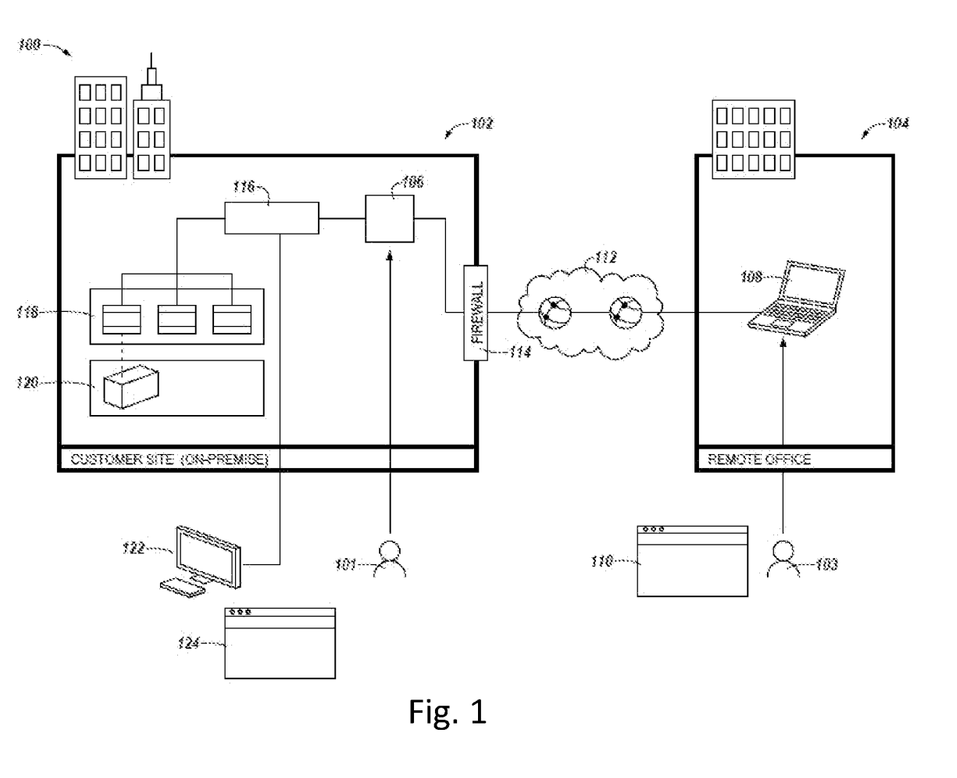
FIG. 1 illustrates a system for extracting and publishing point data from a building site model in accordance with an embodiment of the present disclosure.

FIG. 1 illustrates a system 100 for extracting and publishing point data in accordance with an embodiment of the present disclosure. As shown in FIG. 1, system 100 includes a site (e.g., facility) 102 having components controlled by a building control system, and a remote location 104 at which a system integrator (SI) 103 can connect to the building control system via a remote management application 110 accessed via a remotely located device 108. Although not illustrated in FIG. 1 for simplicity and so as not to obscure embodiments of the present disclosure, system 100 may include additional sites having components controlled by different building control systems, to which SI 103 can connect from remote location 104 in an analogous manner.

The connection between the building control system at site 102 and remote location 104 can be accomplished by communication between a gateway device 106 at site 102 and the remotely located device 108 through an intermediary network 112. For instance, intermediary network 112 can be a network relationship through which gateway device 106 and remotely located device 108 communicate.

Examples of such a network relationship can include a central database (e.g., a cloud computing environment), a wide area network (WAN) such as the Internet, a local area network (LAN), a personal area network (PAN), a campus area network (CAN), or metropolitan area network (MAN), among other types of network relationships. The communication may also traverse through a firewall 114 provided by a network device at site 102. Further, although not illustrated in FIG. 1 for simplicity and so as not to obscure embodiments of the present disclosure, system 100 can include additional gateway devices.

As used herein, a "network" can provide a communication system that directly or indirectly links two or more computers and/or peripheral devices and allows users to access resources on other computing devices and exchange messages with other users. A network can allow users to share resources on their own systems with other network users and to access information on centrally located systems or on systems that are located at remote locations. For example, a network can tie a number of computing devices together to form a distributed control network (e.g., central database).

A network may provide connections to the Internet and/or to the networks of other entities (e.g., organizations, institutions, etc.). Users may interact with network-enabled software applications to make a network request, such as to get a file or print on a network printer. Applications may also communicate with network management software, which can interact with network hardware to transmit information between devices on the network.

Site 102 may include a number of network devices. For instance, in the example illustrated in FIG. 1, site 102 includes a network device 116 (e.g., a switch, hub, router, etc.) that connects gateway 106 to other devices within the network. However, in some embodiments, gateway 106 may be directly connected to one or more network devices.

The network devices may also include a number of connected components 120 controlled by the building control system of site 102, and a number of controllers 118 of the building control system of site 102 that provide functionality to control the operation of components 120. The building control system of site 102 may be controlled via operating protocol software 124 on computing device 122. For instance, operating protocol software 124 may control components 120 either directly or indirectly (e.g., via controllers 118).

The components 120 controlled by the building control system of site 102 can include, for example, equipment, devices, objects, zones (e.g., rooms, areas, spaces, floors, etc.), networks, sensors, and/or component connections, among others. For instance, in an example in which the building control system is a building automation system (BAS) that controls a refrigeration system of site 102, components 120 may include refrigeration and/or freezer cases (e.g., refrigeration cases, freezer display cases, walk in coolers), refrigeration circuits, sensors, refrigeration racks, compressors, fans, tanks, and/or evaporators, among others.

As an additional example in which the building control system is used to control a heating, ventilation, and air conditioning (HVAC) system of site 102, components 120 may include heating and/or cooling valves, chillers, boilers, pumps (e.g., hot and/or chilled water pumps), fans, compressors, air dampers (e.g., VAV dampers), air handling units, coils (e.g., heating and/or cooling coils), air filters, cooling towers, duct work pipes, ventilation, and/or electrical and/or gas distribution equipment, among others. However, embodiments of the present disclosure are not limited to these examples. Further, although one component 120 is illustrated in FIG. 1 for simplicity and so as not to obscure embodiments of the present disclosure, site 102 may include a plurality of connected components controlled by the building control system.

The components 120 may also include a number of points of interest from which point data can be provided. This point data can provide, for example, information about a condition at site 102, the status of the component with which the point of interest is associated, and/or status information about other network devices at site 102. For example, this point data can include refrigeration case temperature and/or pressure, defrost status, HVAC zone temperature and/or humidity, among other types of data. However, embodiments of the present disclosure are not limited to these examples.

In the embodiment shown in FIG. 1, site engineer 101, who can be a laborer not familiar with the operating protocol of the building control system of site 102 or familiar with the various network devices located at site 102 (e.g., device types, capabilities, configuration settings, etc.) can install gateway device 106 during a set up of a new building control system at site 102 or into a legacy system. In the embodiment shown in FIG. 1, this installation can be accomplished by connecting gateway device 106 to network device 116 (e.g., connected to controllers 118 and components 120) and to network 112 that allows gateway device 106 to communicate with remote management application 110.

Further, during the installation of gateway device 106 (e.g., during the set up of the building control system network for site 102) site engineer 101 can provide site specific information. This information can be saved within a site component in the site network and can include information associated with (e.g. about) the site such as, for instance, customer name, vendor name, location (e.g., city, state, country, coordinates), and/or type, and/or number of the site.

It can be noted from the embodiment shown in FIG. 1 that in the past, the SI would need to be present at the installation site (e.g., potentially taking the place of the site engineer) and would need to configure the building control system and the gateway device from the site. When done with that configuration, the SI would need to travel to the next site and configure its building control system and gateway device, and so on until all sites had been set up.

In contrast, in embodiments of the present disclosure, SI 103 can stay at remote location 104 and remotely connect to and configure the building control systems and gateway devices of multiple sites (similar to 102) in rapid succession. For example, SI 103 can use remotely located device 108 to establish and use a gateway system that extracts and publishes point data that can be utilized by a rule-based model mechanism to onboard the various components of the various facilities into the gateway system, as will be further described herein.

Figure 2:
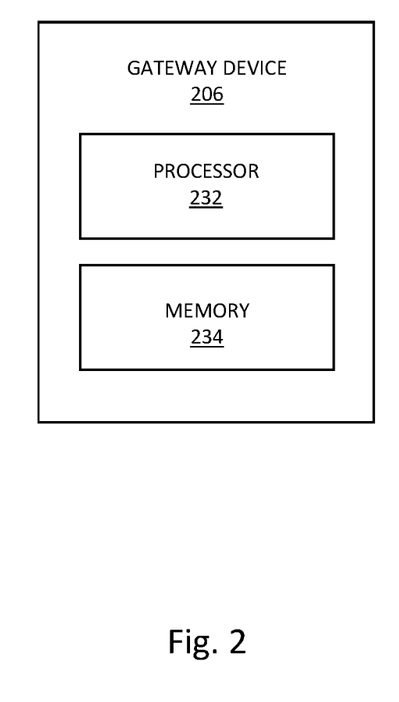
FIG. 2 illustrates a gateway device for extracting and publishing point data from a building site model in accordance with an embodiment of the present disclosure.

FIG. 2 illustrates a gateway device 206 for extracting and publishing point data in accordance with embodiments of the present disclosure. Gateway device 206 can be, for example, gateway device 106 previously described in connection with FIG. 1.

As shown in FIG. 2, gateway device 206 can include a processor 232 and a memory 234. Memory 234 can be any type of storage medium that can be accessed by processor 232 to perform various examples of the present disclosure. For example, memory 234 can be a non-transitory computer readable medium having computer readable instructions (e.g., computer program instructions) stored thereon that are executable by processor 232 to extract and publish point data in accordance with the present disclosure. That is, processor 232 can execute the executable instructions stored in memory 234 to extract and publish point data in accordance with the present disclosure.

Memory 234 can be volatile or nonvolatile memory. Memory 234 can also be removable (e.g., portable) memory, or non-removable (e.g., internal) memory. For example, memory 234 can be random access memory (RAM) (e.g., dynamic random access memory (DRAM), resistive random access memory (RRAM), and/or phase change random access memory (PCRAM)), read-only memory (ROM) (e.g., electrically erasable programmable read-only memory (EEPROM) and/or compact-disk read-only memory (CD-ROM)), flash memory, a laser disk, a digital versatile disk (DVD) or other optical disk storage, and/or a magnetic medium such as magnetic cassettes, tapes, or disks, among other types of memory.

Further, although memory 234 is illustrated as being located in gateway device 206, embodiments of the present disclosure are not so limited. For example, memory 234 can also be located internal to another computing resource (e.g., enabling computer readable instructions to be downloaded over the Internet or another wired or wireless connection).

Gateway device 206 can extract and publish point data, such as data associated with components from the building control system of site 102 previously described in connection with FIG. 1. The gateway device 206 can extract and publish point data across different building control systems of different sites (e.g., different facilities).

The gateway device 106 can extract point data from a building site model within a building control system and publish the point data to a central database. The central database can be within the intermediary network 112 previously described in connection with FIG. 1. The published data may be utilized by a rule-based model mechanism to onboard the various components of the various sites into the gateway system.

The site from which the gateway device 206 extracts point data from can be added to the gateway device 206 using a site selector component. A user (e.g., SI 103 previously described in connection with FIG. 1) can remotely connect to and configure the building control systems and gateway devices of multiple facilities. For instance, after the installation and registration of the gateway device 206, the user can associate at least one site within the building control system to the gateway device 206. The gateway device 206 can extract point data from sites associated with the gateway device 206.

Data extraction can include the gateway device 206 retrieving point data from a building site model which represents a site associated with the gateway device 206. Extracting the point data can be performed by software capable of retrieving the point data from a building site model and adding context to the retrieved point data, such as a data extraction application. In some embodiments, more than one site can be associated with the gateway device 206.

Further, during the installation and registration of the gateway device 206, the gateway device 206 can be associated with a central database. For instance, the gateway device 206 can be associated with a central database that the gateway device 206 is configured to publish the extracted point data to. Thus, the central database can store point data extracted from multiple sites.

The remotely located device 108 previously described in connection with FIG. 1 can be used to register the gateway device 206. The remotely located device can include a user interface.

The user interface can include and/or refer to a mechanism via which the user can interact with the remote device. For example, the user interface can provide (e.g., display) information to, and receive information from (e.g., input by), the user, including information associated with the registration of the gateway device 206.

In an embodiment, the user interface can be a graphical interface (GUI) that can include a display (e.g., a screen and/or monitor) that can provide and/or receive information to and/or from the user. The display can be, for instance, a touch-screen (e.g., the GUI can include touch-screen capabilities). As an additional example, the user interface can include a keyboard and/or mouse that the user can use to input information. Embodiments of the present disclosure, however, are not limited to a particular type of user interface.

Further, the user can remotely connect to and configure the gateway device 206 via the remotely located device. For example, the user can stay at a remote location and remotely connect to and configure the gateway device 206.

Configuring the gateway device 206 can include setting the publish data interval and/or the site extraction details at the gateway device 206. Configuring the site extraction details can allow the gateway device 206 to extract point data from a building site model within the building control system and automatically add context to the extracted point data that is published to the central database.

For example, the gateway device 206 can determine whether point data from a building site model within the building control system is published to the central data. If not, the gateway device 206 can traverse a building site model based on model refs. The gateway device 206 can also extract the contextual details associated with the site, equipment, and points based on the configured site extraction details. The building site model can be serialized by the gateway device 206 into a standardized JavaScript Object Notation (JSON) structure before publishing the extracted point data to the central database. This can allow for easier tagging of the extracted point data.

In some embodiments, the site extraction details can include configuring tags for model tags, extract tags, and model refs. For instance, the user can remotely connect to and configure the tags for the model tags, extract tags, and model refs via the remotely located device. Tags can be a means to convey components in the building control system in parameters. For instance, a tag can be associated with a component and can convey the instance or type parameter for that component. As used herein, a tag can be set of data that indicates a location or characteristic of a component.

Model tags can include tags which determine which components in the building control system are within the site model. Extract tags can include a set of tags that are extracted as a part of the site model. Model refs can include a set of relationships that are traversed recursively to extract the site model from the building control system.

Further, configuring the publish data interval can include determining the frequency that the extracted point data is published to the central database associated with the gateway device 206. For instance, configuring the publish interval can include a user remotely connecting to the gateway device 206 via the remotely located device to set the frequency that gateway device 206 publishes the extracted point data to the central database. This can allow for the gateway device 206 to continuously publish the point data to the central database.

Further, the gateway device 206 can include a mechanism to serialize and export the point data for offline usages. For instance, via the remotely located device, the user can select a model extract format and/or a message format, where the various ontology model extract formats and the messaging formats can be supported by the building control system.

Additionally, the gateway device 206 can automatically update the extracted point data in response to the configuration of the site changing. For example, the gateway device 206 can receive a notification from the building control system that there is a change in the site configuration.

Upon receiving the notification from the building control system, the gateway device 206 can determine whether the point data has been extracted and published to the central database that is associated with the gateway device 206. If the gateway device 206 determines that the point data from the site has not been published to the central database, the gateway device 206 can extract and publish the point data to the central database as described above.

However, if the gateway device 206 determines that point data from the previously configured site has been published, the gateway device 206 can extract the point data from the newly configured site. The point data that is extracted from the newly configured site can be compared to the point data that was extracted from the previously configured site.

Based on the comparison between the previously extracted point data and the newly extracted point data, the gateway device can determine which point data has changed. The gateway device 206 can send the point data that has changed to the central database and the previously published point data can be replaced with point data extracted from the newly configured site. This can allow for the gateway device 206 to quickly and easily sync the published data when the site configuration changes.

Figure 3:
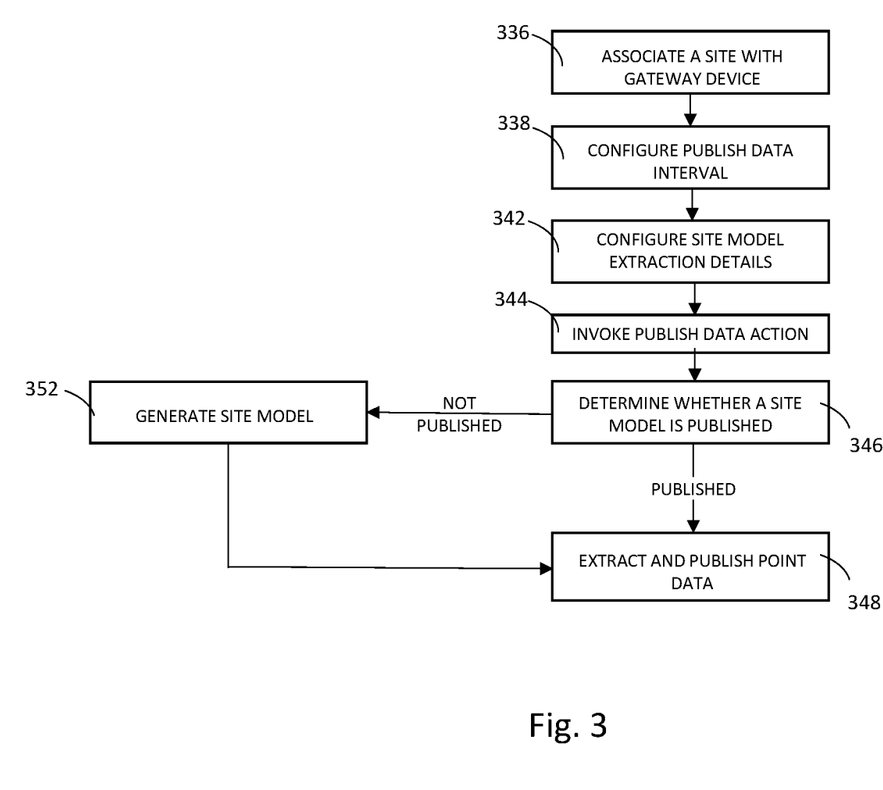
FIG. 3 illustrates an example of a work flow for extracting and publishing point data from a building site model in accordance with an embodiment of the present disclosure.

FIG. 3 illustrates an example of a work flow for extracting and publishing point data from a building site model in accordance with an embodiment of the present disclosure.

At 336, a site within the building control system can be associated with a gateway device. The gateway device can be, for example, gateway device 106 described in connection with FIG. 1 or gateway device 206 described in connection with FIG. 2. The gateway device can be configured to extract point data from the building site model within the building control system and publish the extracted point data to a central database within an intermediary network, such as intermediary network 112 previously described in connection with FIG. 1.

As previously described, a user can remotely connect to and configure the building control systems and gateway devices of multiple sites. For instance, the user can associate at least one site to the gateway device and the gateway device can extract point data from the building site model generated from the site associated with the gateway device. In some embodiments, more than one site can be associated with the gateway device.

At 338, the user can remotely connect to and configure a publish data interval of the gateway device via a remotely located device. Configuring the publish data interval of the gateway device can include setting a frequency that the extracted point data is published to the central database associated with the gateway device. For instance, as previously described, configuring the publish data interval can include a user remotely connecting to the gateway device via the remotely located device to set the frequency that the gateway device publishes the extracted point data to the central database. Configuring the publish data interval can allow for the gateway device to continuously publish the point data to the central database.

At 342, the user can remotely connect to and configure site extraction details of the gateway device via the remotely located device. As previously described, configuring the site extraction details can allow the gateway device to extract point data from a building site model within the building control system and automatically add context to the extracted point data.

The site extraction details can include configuring tags for model tags, extract tags, and model refs. For instance, the user can remotely connect to and configure the tags for the model tags, extract tags, and model refs via the remotely located device.

As discussed above, model tags can include tags which determine which components in the building control system are within the building site model. Extract tags can include a set of tags that are extracted as a part of the building site model. Model refs can include a set of relationships that are traversed recursively to extract the building site model from the building control system.

Extracting the point data using the site extraction details can add context to the point data that is published to the central database. This can allow for easier tagging of the extracted point data.

At 344, the gateway device may invoke a publish data action in response to instructions from the remotely located device. For instance, the user can remotely connect to and instruct the gateway device to publish point data extracted from the building site model associated with the gateway device to the central database that is also associated with the gateway device.

At 346, the gateway device may determine whether a building site model extracted from the site associated with the gateway device has been previously published to the central database. Determining whether a building site model extracted from the site associated with the gateway device has been previously published to the central database can allow the gateway device to determine whether a building site model needs to be generated based on details extracted from the site using the site model extraction details or whether point data can be extracted from an existing building site model.

At 352, the gateway device can generate a building site model based on details extracted from the site using the site model extraction details. For instance, if the gateway device determines a building site model has not been extracted from the site associated with the gateway device and previously published to the central database, the gateway device can generate the building site model based on the details extracted from the site using the site model extraction details. Upon generating the building site model of the site associated with the gateway device, the gateway device may publish the generated building site model to the central database.

At 348, the gateway device may extract and publish point data corresponding to the building site model extracted from the site associated with the gateway device to the central database that is also associated with the gateway device. As previously described, the gateway device may extract point data associated with the components of the site from the published building site model. Additionally, the gateway device may store the extracted point data and publish the extracted point data to the central database in accordance with the publish data interval.

Figure 4:
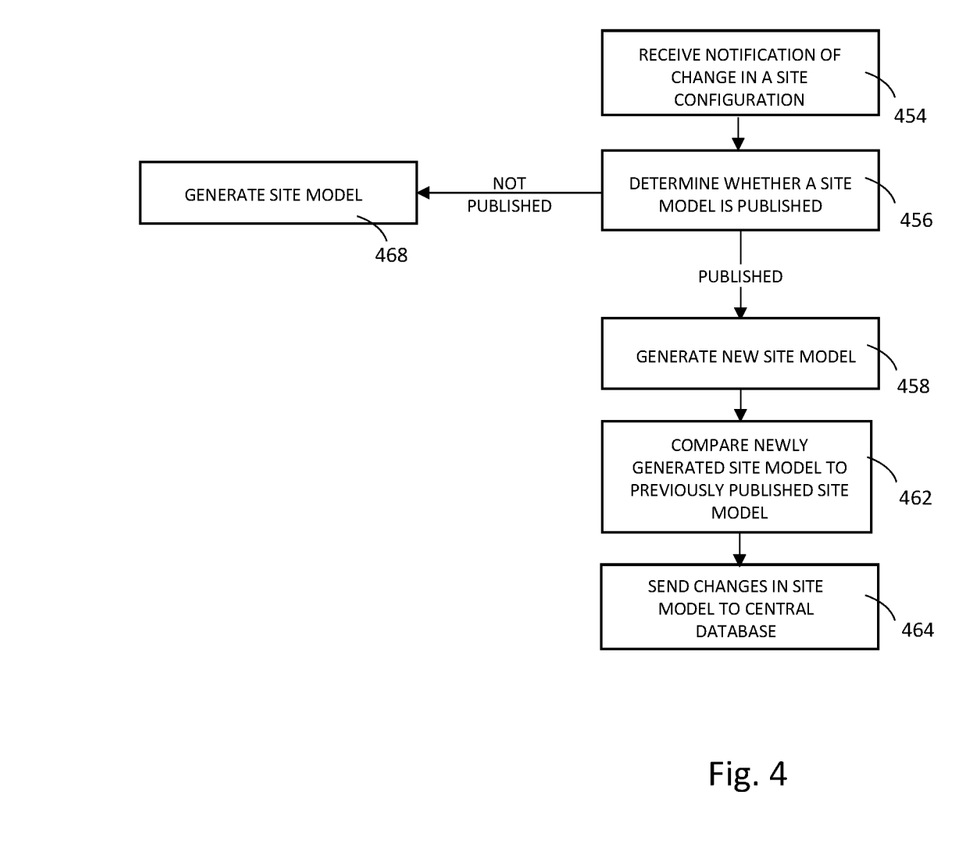
FIG. 4 illustrates another example of a work flow for extracting and publishing point data from a building site model in accordance with an embodiment of the present disclosure.

FIG. 4 illustrates another example of a work flow for extracting and publishing point data from a building site model in accordance with an embodiment of the present disclosure.

At 454, a gateway device may receive a notification of a change in a site configuration. In an example, the gateway device may receive the notification from a remote management device. In such an example, a remote user may determine that there has been a change in the site configuration of the site associated with the gateway device, as previously described. Using the remote management device, the gateway device can be notified of the configuration change.

At 456, the gateway device may determine whether a building site model extracted from the site associated with the gateway device has been previously published to the central database. Determining whether a building site model extracted from the site associated with the gateway device has been previously published to the central database can allow the gateway device to determine whether a new building site model needs to be generated based on details extracted from the newly configured site using the site model extraction details or whether point data can be extracted from an existing building site model.

At 468, in an example where the gateway device determines that a building site model extracted from the site associated with the gateway device has not been previously published to the central database, the gateway device can generate and publish a building site model based on details extracted from the site using the site model extraction details, as previously described.

At 458, in an example where the gateway device determines that a building site model extracted from the site associated with the gateway device has been previously published to the central database, the gateway device can generate a new building site model based on details extracted from the newly configured site using the site model extraction details. For instance, if the gateway device determines a building site model has been previously published to the central database, the gateway device can generate the new building site model based on the details extracted from the newly configured site using the site model extraction details. Upon generating the new building site model of the site associated with the gateway device, the gateway device may publish the newly generated building site model to the central database.

At 462, the gateway device may compare the newly generated building site model to the previously published building site model, where both the newly generated building site model and the previously published building site model correspond to the site associate with the gateway device. For example, the gateway device can compare the model data extracted from the previously configured site and the model data extracted from the newly configured site using the model extraction details.

At 464, the gateway device may send changes in the building site model to the central database based on the comparison between the previously published building site model and the newly generated building site model. Sending the changes in the building site model to the central database allows for a building site model that corresponds to the newly configured site to be published. This allows for the gateway device to extract point data from the most recent published building site model and publish the extracted point data to the central database associated with the gateway device.

Figure 5:
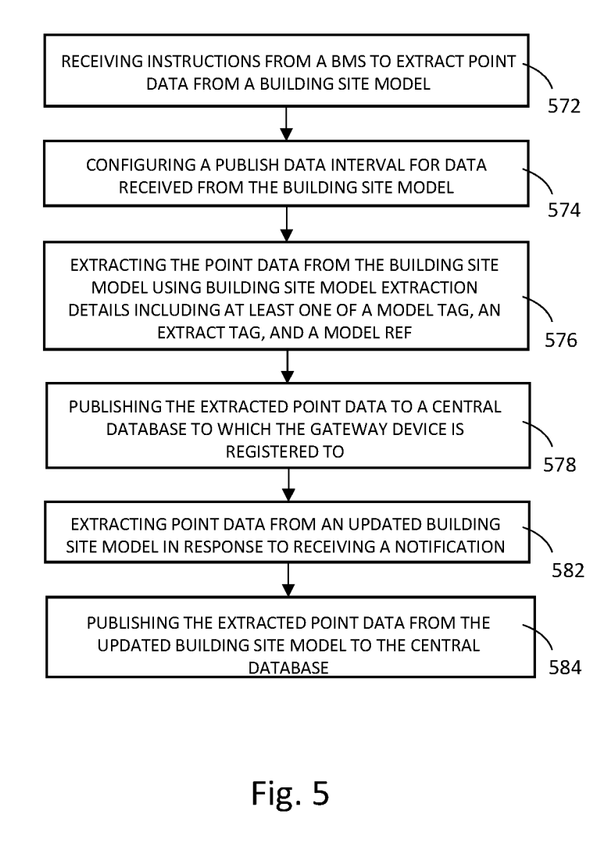
FIG. 5 illustrates an example of a method for extracting and publishing point data from a building site model in accordance with an embodiment of the present disclosure.

FIG. 5 illustrates an example of a method 540 for extracting and publishing point data in accordance with an embodiment of the present disclosure.

At 572, the method 540 can include receiving, at a gateway device, instructions from a building control system to extract point data from a building site model within the building control system. As described herein, the gateway device can be registered by the user and a building site model can be extracted from the site associated with the gateway device and published to a central database also associated with the gateway device. The BMS can send instructions to the gateway device to extract point data from the published building site model.

At 574, the method 540 can include configuring, at the gateway device, a publish data interval. As described herein, the gateway device can extract and publish the point data extracted from the building site model. In an example, the gateway device can set an automated time triggered mechanism to continuously publish the extracted point data to an end point. For instance, the gateway device can set an interval of time that the extracted point data is published to the central database.

At 576, the method 540 can include extracting point data from the building site model using building site model extraction details including at least one of a model tag, an extract tag, and a model ref. As described herein, the gateway device can extract the point data from the building site model using a number of configuration tags allowing for contextually rich point data to be published to the central database. For instance, the gateway device can extract all of the contextual details associated with the building site model and equipment based on the configuration tag details so that the building site model can be serialized into a standardized JSON structure.

At 578, the method 540 can include publishing, at the gateway device, the extracted point data to a central database to which the gateway device is registered to. As described herein, the gateway device can publish the standardized JSON structure to a model store within the central database. The central database can include point data extracted from a number of building model sites included within the BMS.

At 582, the method 540 can include extracting, at the gateway device, point data from an updated building site model in response to receiving a notification. As described herein, the configuration of the building site model can change and in response to the configuration change the gateway device can receive a notification from a remote user. In response to the notification that the building site model has been updated, the gateway device can extract point data from the updated building site model and compare the updated building site model to the previously published point data extracted from the previous building site model.

At 584, the method 540 can include publishing, at the gateway device, the extracted point data from the updated building site model to the central database. As described herein, the point data that the gateway device determines has changed between the previous building site model and the updated building site model can be published to the central database.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A non-transitory machine-readable medium storing instructions executable by a processing resource of a gateway device at a site, wherein the gateway device is connected to a building control system of the site via a local network and is further connected to a remotely located device remote from the site via an intermediary network, the instructions when executed by the processing resources of the gateway device cause the gateway device to:
   receive input from a user of the remotely located device via the intermediary network to register the gateway device with a central database;
   traverse via the local network the building control system of the site, and extract site details regarding the building control system, including contextual details associated with components and points of the building control system of the site;
   generate a building site model for the building control system of the site based on the extracted site details;
   extract point data from the generated building site model;
   publish the extracted point data via the intermediary network to the central database to which the gateway device is registered; and
   automatically update the published extracted point data within the central database at a programmed time interval, wherein the programmed time interval is programmable from the remotely located device across the intermediary network.

2. The medium of claim 1, wherein the building control system of the site has a number of components, wherein point data that is extracted is selected from a set of point data and wherein the point data selected for extraction is determined based on one or more tags associated with each BMS of one or more of the components.

3. The medium of claim 1, wherein the building control system of the site has a number of components, and wherein the contextual details associated with each of one or more of the components includes a model tag, wherein the model tag that determines which components are part of the building site model.

4. The medium of claim 1, wherein the building control system of the site has a number of components, and wherein the contextual details associated with one or more of the components includes one or more extract tags that are extracted as a part of generating the building site model.

5. The medium of claim 2, wherein the contextual details comprise a model reference that includes a set of relationships that are traversed to generate extract the building site model.

6. The medium of claim 1, further including instructions executable by a processing resource to:
   receive a notification of a reconfiguration in the building control system of the site;
   traverse via the local network the reconfigured building control system of the site, and extract site details regarding the reconfigured building control system, including contextual details associated with components and points of the reconfigured building control system of the site;

generate an updated building site model for the reconfigured building control system of the site based on the extracted site details;

extract updated point data from the updated building site model; and publish updated point data extracted from the reconfigured building site model.

7. A gateway device of a site, wherein the gateway device is connected to a building control system of the site via a local network and is further connected to a remotely located device remote from the site via an intermediary network, the gateway device comprising:

a processing resource; and a memory resource storing machine-readable instructions to cause the processing resource to:

receive input from a user of the remotely located device via the intermediary network to register the gateway device with a central database;

traverse via the local network the building control system of the site, and extract site details regarding the building control system, including contextual details associated with components and points of the building control system of the site;

generate a building site model for the building control system of the site based on the extracted site details;

extract point data from the generated building site model;

publish the extracted point data via the intermediary network to the central database to which the gateway device is registered;

automatically update the published extracted point data within the central database at a programmed time interval, wherein the programmed time interval is programmable from the remotely located device across the intermediary network.

8. The gateway device of claim 7, wherein the extracted point data corresponds points of one or more components of the building control system of the site that are represented in the generated building site model.

9. The gateway device of claim 7, wherein the gateway device is associated with building control systems at a plurality of sites.

10. The gateway device of claim 7, wherein the central database is in a cloud computing environment accessible by the gateway device over the intermediary network.

11. The gateway device of claim 7, further including instructions to:

receive a notification of a reconfiguration of the building control system of the site;

traverse via the local network the reconfigured building control system of the site, and extract site details regarding the reconfigured building control system, including contextual details associated with components and points of the reconfigured building control system of the site;

generate an updated building site model for the reconfigured building control system of the site based on the extracted site details;

extract updated point data from the updated building site model; and publish updated point data extracted from the reconfigured building site model.

12. The gateway device of claim 7, wherein the gateway device is utilized in an Internet of things (IoT) gateway service.

13. The gateway device of claim 7, further including instructions to cause the processing resource to:

publish the generated building site model to the central database.

14. A method for configuring a building control site using a gateway device, wherein the gateway device is connected to the building control system of the site via a local network and is further connected to a remotely located device remote from the site via an intermediary network, the method comprising:

receiving input from a user of the remotely located device via the intermediary network to register the gateway device with a central database;

traversing via the local network the building control system of the site, and extracting site details regarding the building control system, including contextual details associated with components and points of the building control system of the site;

generating a building site model for the building control system of the site based on the extracted site details;

extracting point data from the generated building site model within the building control system;

publishing the extracted point data via the intermediary network to the central database to which the gateway device is registered; and automatically updating the published extracted point data within the central database at a programmed time interval, wherein the programmed time interval is programmable from the remotely located device across the intermediary network.

15. The method of claim 14, further including:

receiving a notification of a reconfiguration of the building control system of the site;

traversing via the local network the reconfigured building control system of the site, and extracting site details regarding the reconfigured building control system, including contextual details associated with components and points of the reconfigured building control system of the site;

generating an updated building site model for the reconfigured building control system of the site based on the extracted site details;

extracting updated point data from the updated building site model; and publishing updated point data extracted from the reconfigured building site model.

16. The method of claim 15, wherein in response to receiving the notification of the reconfiguration of the building control system of the site or detecting a change in a status of a the component within the building control system, the gateway device comparing the generated building site model against the updated building site model.

17. The method of claim 16, wherein the gateway device constructs a changed model JavaScript Object Notation (JSON) format based on the comparison of the generated building site model against the updated building site model.

18. The method of claim 17, wherein the changed model JSON format is published to a model store within the central database.

* * * * *